(12) United States Patent  
Kishibata

(10) Patent No.: US 11,217,945 B2  
(45) Date of Patent: Jan. 4, 2022

(54) ELECTRONIC COMPONENT UNIT

(71) Applicant: Yazaki Corporation, Tokyo (JP)

(72) Inventor: Yuya Kishibata, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 16/868,760

(22) Filed: May 7, 2020

(65) Prior Publication Data

US 2020/0388968 A1 Dec. 10, 2020

(30) Foreign Application Priority Data

Jun. 10, 2019 (JP) .............................. JP2019-108138

(51) Int. Cl.
| | | |
|---|---|---|
| *H01R 13/66* | (2006.01) | |
| *H01R 12/71* | (2011.01) | |
| *H01R 13/502* | (2006.01) | |
| *H01R 13/516* | (2006.01) | |
| *H05K 3/34* | (2006.01) | |
| *H05K 5/00* | (2006.01) | |
| *H05K 1/18* | (2006.01) | |

(52) U.S. Cl.
CPC ......... *H01R 13/6608* (2013.01); *H01R 12/71* (2013.01); *H01R 13/502* (2013.01); *H01R 13/516* (2013.01); *H05K 1/18* (2013.01); *H05K 3/34* (2013.01); *H05K 5/006* (2013.01)

(58) Field of Classification Search
CPC ................ H05K 5/0069; H01R 13/639; H01R 12/7052; H01R 12/727; H01R 13/6581; H01R 13/5213; H01R 12/724
See application file for complete search history.

(56) References Cited

U.S. PATENT DOCUMENTS

| 10,186,813 | B2 * | 1/2019 | Kawamura | ......... B60R 16/0238 |
|---|---|---|---|---|
| 2004/0229077 | A1 | 11/2004 | Mori et al. | |
| 2006/0035531 | A1 * | 2/2006 | Ngo | ................... H01R 13/6658 |
| | | | | 439/701 |
| 2011/0170269 | A1 | 7/2011 | Blossfeld et al. | |
| 2012/0094509 | A1 * | 4/2012 | Bryan | ................. B60Q 11/005 |
| | | | | 439/76.1 |
| 2013/0122745 | A1 * | 5/2013 | Soubh | .................. H01R 12/716 |
| | | | | 439/607.09 |
| 2014/0090246 | A1 | 4/2014 | Blossfeld et al. | |

(Continued)

FOREIGN PATENT DOCUMENTS

| CN | 101926060 A | 12/2010 |
|---|---|---|
| CN | 107926131 A | 4/2018 |

(Continued)

*Primary Examiner* — Jean F Duverne

(74) *Attorney, Agent, or Firm* — Sughrue Mion, PLLC

(57) ABSTRACT

An electronic component unit includes: a circuit board to mount an electronic component on the circuit board; a connector to receive and retain a terminal to be electrically connected to the circuit board; and a cover assembled to the connector and housing the circuit board. The circuit board is retained with the cover by using a beard retaining portion integrated with or separate from the cover. The connector has a cover retaining portion including a pair of protrusion portions. The cover retaining portion retains the cover assembled to the connector by holding a part of the cover between the pair of the protrusion portions.

5 Claims, 5 Drawing Sheets

(56) References Cited

U.S. PATENT DOCUMENTS

| | | |
|---|---|---|
| 2014/0092570 A1 | 4/2014 | Blossfeld et al. |
| 2016/0157364 A1 | 6/2016 | Blossfeld et al. |
| 2017/0079154 A1 | 3/2017 | Gunes |
| 2018/0109044 A1 | 4/2018 | Kawamura et al. |

FOREIGN PATENT DOCUMENTS

| | | |
|---|---|---|
| DE | 10 2012 203 634 A1 | 9/2013 |
| JP | 11068339 A | 3/1999 |
| JP | 11167967 A | 6/1999 |
| JP | 2007-329049 A | 12/2007 |
| JP | 2013-206592 A | 10/2013 |
| JP | 2018-67987 A | 4/2018 |
| KR | 20-0471891 Y1 | 4/2014 |

\* cited by examiner

ELECTRONIC COMPONENT UNIT

CROSS-REFERENCES TO RELATED APPLICATION(S)

This application is based on and claims priority from Japanese Patent Application No 2019-108138 filed on Jun. 10, 2019, and the entire contents of which are incorporated herein by reference.

BACKGROUND

Field of the Invention

The present invention relates to an electronic component unit in which a circuit board mounted with an electronic component and a connector is received in a cover.

Description of Related Art

Electronic component units have been proposed in the background art. Each of the electronic component units has a configuration in which a connector or the like is assembled connecting to a circuit board on which an electronic component is provided, and the circuit board is further received in a casing provided for anti-noise measures etc. For example, one of the electronic component units in the background art uses bolts to fasten the circuit board and the connector to each other so as to suppress relative movement between the circuit board and the connector. Thus, damage etc. to electrical contact points (generally, places where terminals extending from the connector are fixed to the circuit board by soldering or the like) between the circuit board and the connector can be suppressed even when external force such as vibration reaches the electronic component unit.

As for details of the above connector, refer to JP 2007-329049 A.

SUMMARY

The aforementioned background-art electronic component unit has a merit of reducing stress that may occur at the electrical contact points between the circuit board and the connector (specifically, the places where the circuit board and the terminals are connected to each other), but has a demerit of complicating the step of fastening the circuit board and the connector to each other by the bolts one by one so as to make it difficult to improve productivity or reduce manufacturing cost. Thus, it is considered that the background-art electronic component unit still has room for further improvement in simplification of the manufacturing process.

An object of the present invention is to provide an electronic component unit which can compatibly attain protection of electrical contact points between a circuit board and a connector and simplification of a manufacturing process.

Embodiments of the present invention provide the following items [1] to [4]:

[1] An electronic component unit comprising:
a circuit board to mount an electronic component on the circuit board; a connector to receive and retain a terminal to be electrically connected to the circuit board; and a cover assembled to the connector and housing the circuit board, the circuit board being retained with the cover by using a board retaining portion integrated with or separate from the cover,
the connector having a cover retaining portion including a pair of protrusion portions, the cover retaining portion retaining the cover assembled to the connector by holding a part of the cover between the pair of the protrusion portions.

[2] The electronic component unit according to the item [1], wherein
the cover is assembled to the connector while moving in a preset assembling direction relatively to the connector,
one of the cover retaining portion and another of the cover retaining portion are located to sandwich a center point of the connector in the assembling direction.

[3] The electronic component unit according to the item [1] or [2], wherein
at least one of the pair of the protrusion portions has a convex part protruding toward another of the pair of the protrusion portions,

[4] The electronic component unit according to the item [3], wherein
the one of the pair of the protrusion portions has at least two convex pans arranged with a preset interval in the assembling direction,
the another of the pair of the protrusion portions has the convex part protruding toward the one of the pair of the protrusion portions at a position corresponding to an intermediate part between the at least two convex parts of the one of the pair of protrusion portions.

According to first aspect of the invention, relating to the item [1], the portion of the cover is retained by the pair of the protrusion portions of each of the cover retaining portions belonging to the connector (e.g. press-fitted between the protrusion portions). Thus, relative movement between the connector and the cover can be suppressed. That is, so-called backlash reduction can be achieved. Further, the circuit board is retained on the cover by use of the board retaining portion (e.g. a rib etc. provided on the cover per se) As a result of these contrivances the circuit board is in a state fixed to the connector via the cover so that relative movement between the circuit board and the connector can be suppressed. Accordingly, it is possible to reduce stress that may occur at an electrical contact point between the circuit board and the connector (specifically the terminal) in a manner similar to or the same as that in a case where the circuit board and the connector are directly fastened to each other by bolts as in the background-art electronic component unit. In addition, a manufacturing process of the electronic component unit can be simplified when the step of retaining the circuit beard by the board retaining portion is made simpler than the fastening step using the bolts. Accordingly, the electronic component unit having the present configuration can compatibly attain protection of the electrical contact point between the circuit board and the connector and simplification of the manufacturing process.

According to second aspect of the invention, relating to the item [2], pairs of protrusion portions are provided at at least two places of the connector. The central position of the connector in the assembling direction of the cover is sandwiched between the two places. For example, in a case where the cover is assembled connecting to the connector while moving downward from the top of the connector, the pairs of the protrusion portions are provided at the two places between which the central position of the connector in the up/down direction is sandwiched. Thus, relative movement such as rotation of the cover with respect to the connector can be suppressed particularly effectively.

Incidentally, generally, the connector is mounted on a peripheral edge portion of the circuit board and the cover has a shape spreading along a board face of the circuit board from the connector. Accordingly, suppression of rotation of the cover around the connector is particularly useful for protection of the electrical contact point in the electronic component unit having such a general configuration.

According to third aspect of the invention, relating to the item [3], each of the cover retaining portions has the convex part protruding from one of the pair of the protrusion portions toward the other of the pair of the protrusion portions. Thus, force required for inserting (e.g. press-fitting) the cover between the protrusion portions can be reduced without impairing cover retention performance, in comparison with that in a case where the cover is held between and retained by the protrusion portions each of which is not provided with any convex part but flat. In addition by adjustment of protrusion height of the convex part, width of a protrusion end, or the like, the covering retaining portion can exert stable retention performance regardless of a dimensional error (i.e an inevitable manufacturing variation) of each of the pair of the protrusion portions or the cover.

According to fourth aspect of the invention, relating to the item [4], the convex part is provided in the other of the pair of the protrusion portions so as to be positioned between the at least two convex parts provided in the one of the pair of the protrusion portions. That is, the pair of the protrusion portions are configured so that the convex parts are disposed alternately. Thus, cover retention performance can be further improved in comparison with that in a case where the convex part is merely provided in each of the protrusion portions.

Thus, according to the present invention, it is possible to provide an electronic component unit which can compatibly attain protection of an electrical contact point between a circuit board and a connector and simplification of a manufacturing process.

The invention has been described above concisely. The details of the invention will become more apparent when the modes for carrying out the invention (hereinafter referred to as an embodiment) described below are read through with reference to the accompanying drawings.

DETAILED DESCRIPTION

Embodiment

Figure 1:
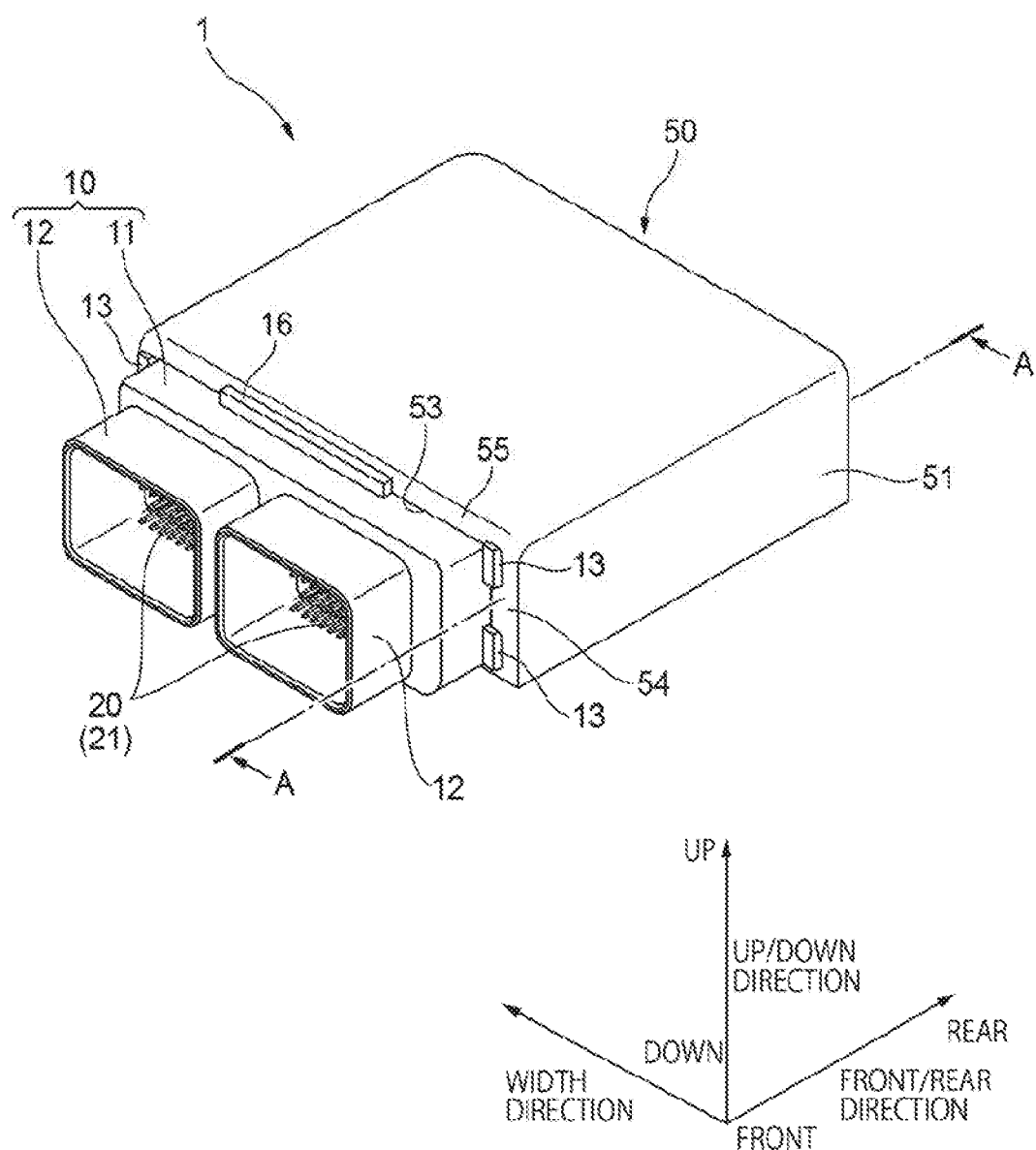
FIG. 1 is a perspective view of an electronic component unit according to an embodiment of the present invention.

An electronic component unit 1 according to an embodiment of the present invention will be described below with reference to the drawings. As shown in FIG. 1 to FIG. 3B, the electronic component unit 1 is provided with a connector 10, a plurality of terminals 20, a circuit board 30, an aligning plate 40, and a cover 50. The plurality of terminals 20 are attached to the connector 10. The circuit board 30 has a plurality of through holes 31. The aligning plate 40 aligns the plurality of terminals 20 with the plurality of through holes 31. The cover 50 houses the circuit board 30.

In the electronic component unit 1, a counterpart housing (not shown) of a counterpart connector is fitted to hood portions 12 (which will be described later) of the connector 10. Thus, counterpart terminals (not shown) received in the counterpart housing and conductor patterns (not shown) of the circuit board 30 are electrically connected to each other through the terminals 20.

A "front/rear direction", an "up/down direction", a "width direction", "front", "rear", "up" and "down" will be defined below for explanatory convenience, as shown in FIG. 1. The front/rear direction, the up/down direction, and the width direction perpendicularly intersect with one another. The front/rear direction agrees with a direction in which the connector 10 and the counterpart housing are fitted to each other. The respective components constituting the electronic component unit 1 will be described sequentially below.

Figure 2:
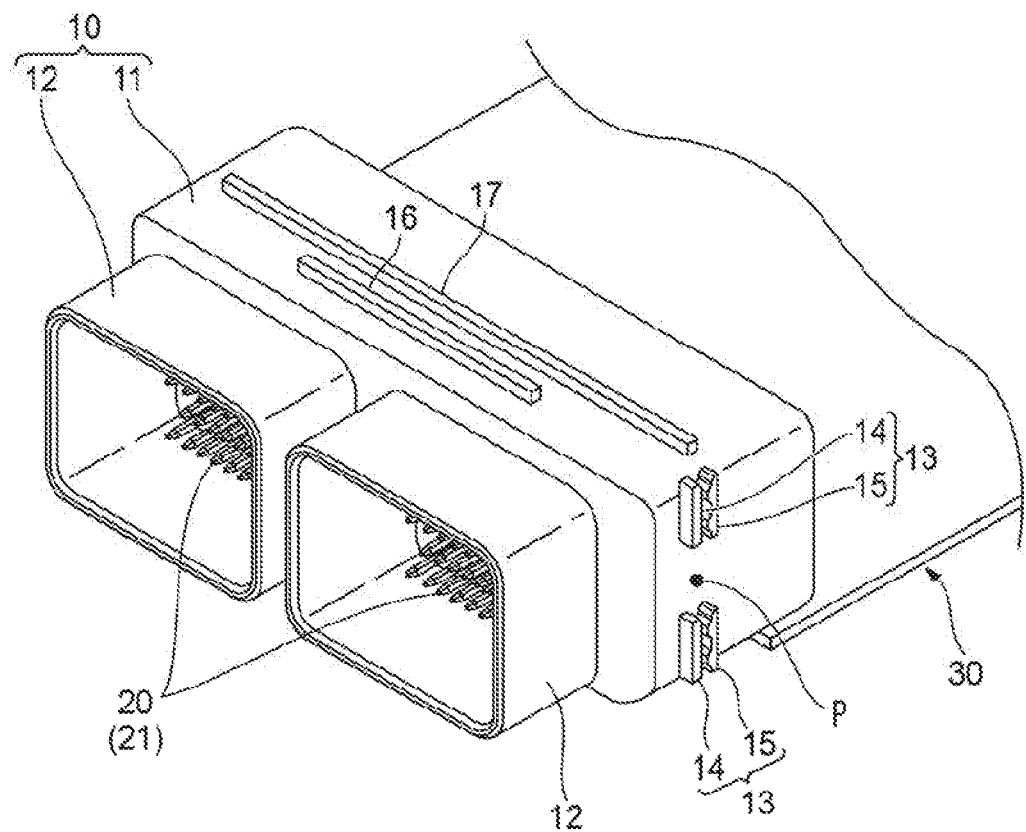
FIG. 2 is a perspective view of the electronic component unit shown in FIG. 1 in a state in which a cover of the electronic component unit has been removed.

First, the connector 10 will be described. As shown in FIG. 1 to FIG. 3B, the connector 10 made of a resin has a terminal retaining portion 11 and a pair of the hood portions 12 integrally. The pair of the hood portions 12 protrude forward from the terminal retaining portion 11. As shown in FIG. 2, the terminal retaining portion 11 has an approximately rectangular parallelepiped shape extending in the width direction. A plurality of press-fitting holes (not shown) bored in the front/rear direction in order to press-fit and receive connection terminal portions 21 (which will be described later) of the terminals 20 therein are formed in the terminal retaining portion 11 so as to be arranged side by side with preset patterns.

The pair of the hoed portions 12 protrude frontward from a front face of the terminal retaining portion 11 to be arranged side by side in the width direction and to make the inside of the hood portions 12 communicate with tire press-fitting holes. Each of the hood portions 12 has a rectangular hood shape whose front is opened. Distal end portions of the connection terminal portions 21 which have been press-fitted into the press-fitting holes of the terminal retaining portion 11 from a rear side so as to penetrate the press-fitting holes of the terminal retaining portion 11 are positioned inside the hood portion 12. The connection terminal portions 21 positioned inside the hood portion 12 are connected to the corresponding counterpart terminals received in the counterpart housing fitted to the connector 10.

As shown in FIG. 2, cover retaining portions 13 each constituted by a pair of protrusion portions 14 and 15 are provided respectively at two places, i.e. an upper end portion and a lower end portion in a front/rear-direction preset position on each of widthwise opposite outer faces of the approximately rectangular parallelepiped terminal retaining portion 11. As will be described in detail later, side edge portions 54 of the cover 50 are press-fitted between the pairs of the protrusion portions 14 and 15 while the cover 50 is moved downward from top. Thus, the cover 50 is retained by the cover retaining portions 13. Accordingly, the two cover retaining portions 13 are provided at at least two places between which a central position P of the connector 10 in an assembling direction of the cover 50 is sandwiched.

Figure 4A:
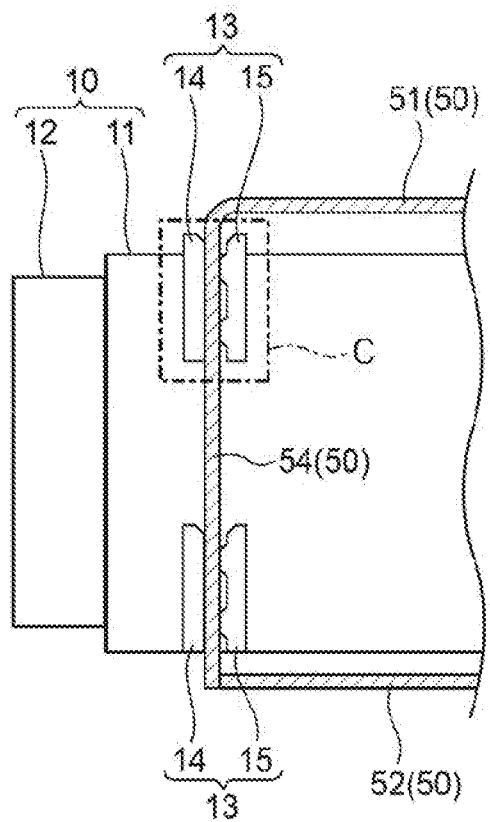
FIG. 4A is a view showing a portion of a section taken along a line A-A of FIG. 1.
Figure 4B:
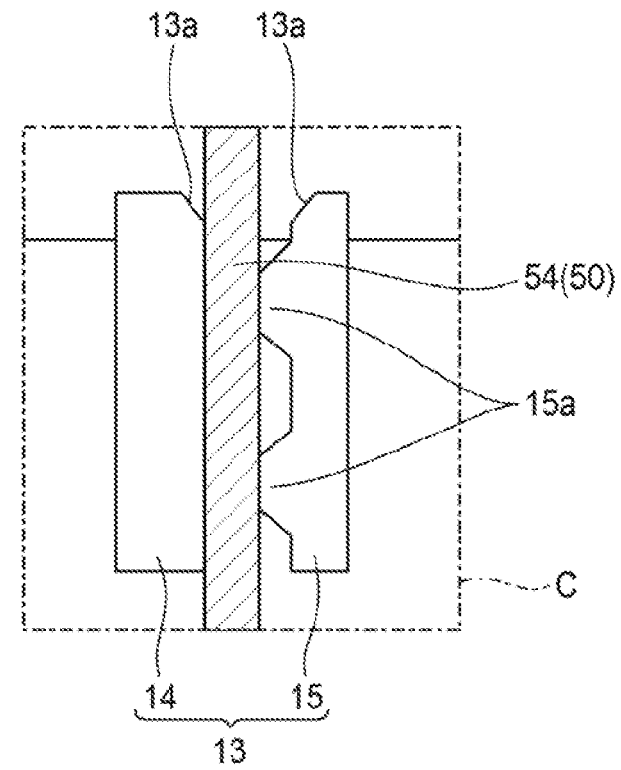
FIG. 4B is an enlarged view of a portion C of FIG. 4A.

In the present example, each of the cover retaining portions 13 is constituted by the front side protrusion portion 14 and the rear side protrusion portion 15, as shown in FIGS. 4A and 4B (particularly FIG. 4B). The front side protrusion portion 14 is a protrusive strip extending in the up/down direction. The rear side protrusion portion 15 extends in the up/down direction on a rear side of the front side protrusion portion 14 so as to be opposed to the front side protrusion portion 14 and separated from the front side protrusion portion 14 by a preset distance in the front/rear direction. A pair of taper portions 13a are provided at upper end portions of opposed faces of the front side protrusion portion 14 and the rear side protrusion portion 15 so as to spread apart from each other toward the top.

Convex parts 15a protruding toward the front (the front side protrusion portion 14) are provided at two places with a preset interval in the up/down direction in the front face (the face facing the front side protrusion portion 14) of the rear side protrusion portion 15. A front/rear-direction interval between the front side protrusion portion 14 and each of top portions of the convex parts 15a is slightly smaller than a thickness (plate thickness) of the side edge portion 54 of the cover 50. Accordingly, the side edge portion 54 of the cover 50 can be press-fitted between the front side protrusion portion 14 and the rear side protrusion portion 15 (specifically between the front side protrusion portion 14 and the convex parts 15a of the rear side protrusion portion 15).

As shown in FIG. 2, a pair of protrusive strip portions 16 and 17 extending in the width direction and separated from each other by a preset distance in the front/down direction are provided on an upper outer face of the approximately rectangular parallelepiped terminal retaining portion 11 and at the same positions as the pairs of the protrusion portions 14 and 15 of the cover retaining portions 13 in the front/rear direction. An upper edge portion 55 of the cover 50 is inserted between the pair of the protrusive strip portions 16 and 17 (see FIG. 1). The upper edge portion 55 will be described later.

Figure 3A:
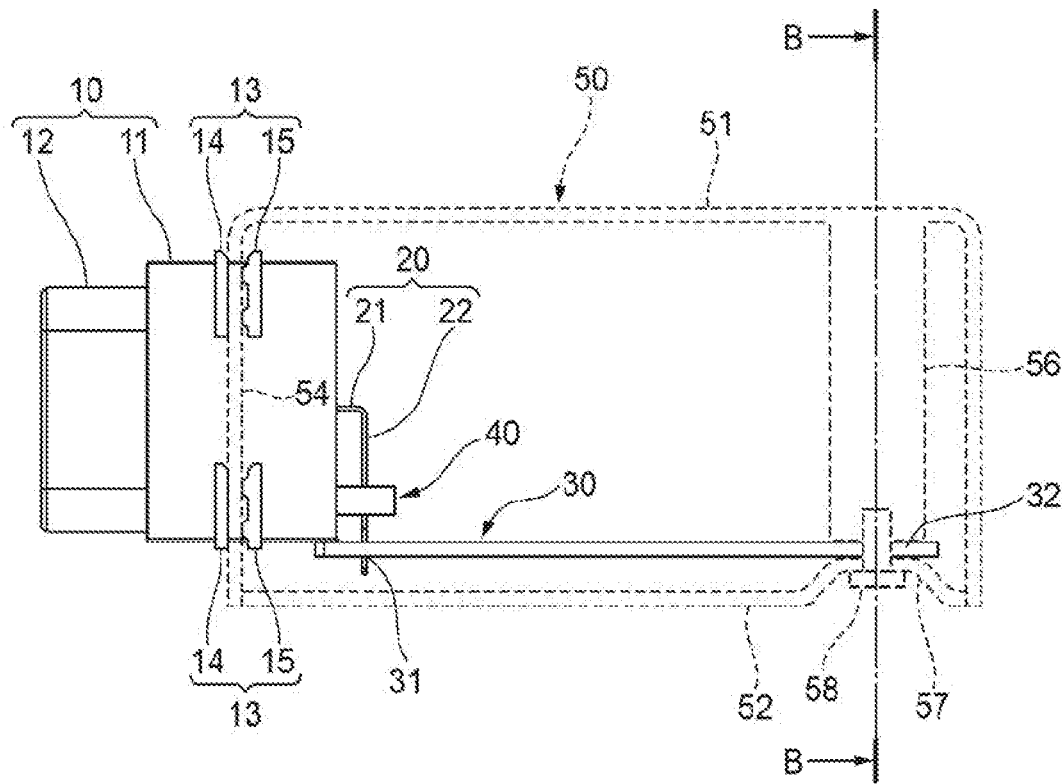
FIG. 3A and FIG. 3B are side views of the electronic component unit shown in FIG. 1, in which the inside of the cover is drawn in perspective.

Next, the terminals 20 will be described. As shown in FIG. 3A, each of the terminals 20 made of metal is formed by machining a rod-like member which is shaped like a quadrilateral in cross section and which is made of a metal material such as copper, a copper alloy, or the like. The terminal 20 has an L-shape, comprising a linear connection terminal portion 21 which extends in the front/rear direction, and a linear mounting terminal portion 22 which is bent from a rear end portion of the connection terminal portion 21 to extend downward. A distal end portion (lower end portion) of the mounting terminal portion 22 is inserted into a corresponding one of the through holes 31 of the circuit board 30.

Figure 3B:
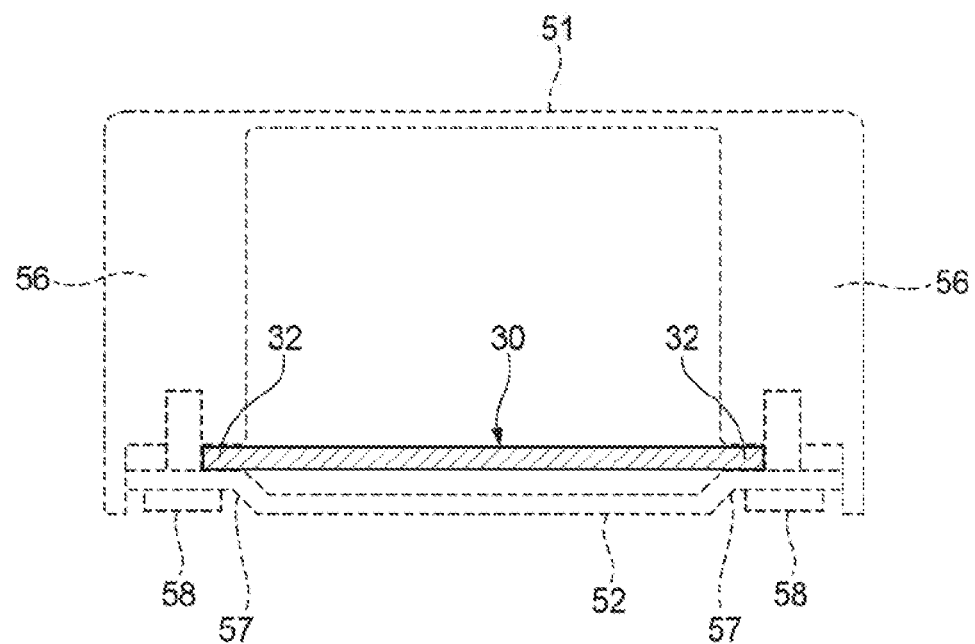

Next, the circuit board 30 will be described. The circuit board 30 which is made of a resin and on which an electronic component (not shown) is provided has a rectangular flat plate shape in the present example. As shown in FIG. 3A and FIG. 3B, the through holes 31 into which the distal end portions of the mounting terminal portions 22 of the terminals 20 are inserted are formed in the circuit board 30 and at a position (a front edge portion of the circuit board 30 in the present example) where the connector 10 is mounted, so that the through holes 31 are arranged side by side with preset patterns. The mounting terminal portions 22 (i.e. the terminals 20) which have been inserted into the through holes 31 are soldered to conductor patterns (not shown) formed on a back face (lower face) of the circuit board 30 so as to be electrically connected to the conductor patterns.

The places where the mounting terminal portions 22 and the through holes 31 are soldered to each other thus will be hereinafter also referred to as "electrical contact points between the connector 10 and the circuit board 30".

Next, the aligning plate 40 will be described. As shown in FIG. 3A, the aligning plate 40 made of a resin has a long and narrow flat plate shape extending in the width direction. A plurality of through holes (not shown) through which the mounting terminal portions 22 of the terminals 20 are inserted are formed in the aligning plate 40 so as to be arranged side by side with preset patterns. The aligning plate 40 is assembled connecting to the back face (rear face) of the terminal retaining portion 11 of the connector 10, as shown in FIG. 3A.

Next, the cover 50 will be described. The cover 50 is made of metal (typically made of aluminum or an aluminum alloy). As shown in FIG. 1. FIG. 3A and FIG. 3B, the cover 50 is constituted by a body portion 51 which is shaped like a rectangular box and which is opened to the lower side, and a bottom plate portion 52 which is shaped like a rectangular flat plate and which is assembled connecting to the body portion 51 so as to close the lower side opening of the body portion 51. As shown in FIGS. 3A and 3B, the circuit board 30 is received in a space (a hollow portion of the cover 50) formed by the body portion 51, the bottom plate portion 52 and the connector 10. The cover 50 made of metal has a function of shielding external noise from travelling toward the electronic component provided on the circuit board 30 in addition to a function of physically protecting the circuit board 30.

As shown in FIG. 1, a concave portion 53 for receiving the terminal retaining portion 11 of the connector 10 is formed in a front wall of the body portion 51. The concave portion 53 is recessed on an upper side and opened to the lower side. The concave portion 53 is constituted by the pair of the side edge portions 54 and the upper edge portion 55. As shown in FIG. 3A and FIG. 3B, columnar portions 56 extending along inner faces of side walls of the body portion 51 and downward from an upper wall of the body portion 51 are provided in the vicinity of a rear wall of the body portion 51. The columnar portions 56 are provided on the widthwise opposite side walls of the body portion 51. Incidentally, the columnar portions 56 protrude inward of the hollow portion from the side walls of the body portions, and cannot be visibly recognized from the outside of the body portion 51.

Concave portions 57 recessed so as to be offset in directions approaching the columnar portions 56 (i.e. upward) are formed in the bottom plate portion 52 and at positions corresponding to the columnar portions 56 of the body portion 51. The concave portions 57 and the columnar portions 56 are fastened to each other by bolts 58. By the fastening, the body portion 51 and the bottom plate portion 52 are coupled integrally.

Here, as shown in FIG. 3A and FIG. 3B, the columnar portions 56 and the concave portions 57 are fastened to each other in a state in which peripheral edge portions 32 of the circuit board 30 are interposed between the concave portions 57 and the columnar portions 56. In other words, the circuit board 30 is held between the columnar portions 56 and the concave portions 57 so as to be retained in the cover 50. Accordingly, the columnar portions 56 and the concave portions 57 also have a function of retaining the circuit board 30 in addition to a function of coupling the body portion 51 and the bottom plate portion 52 of the cover 50 to each other. The columnar portions 56 and the concave portions 57 will be hereinafter also referred to as "board retaining portions".

Incidentally, as understood from the above description, the peripheral edge portions 32 of the circuit board 30 are held between the columnar portions 56 and the concave portions 57 during a step of fastening the columnar portions 56 and the concave portions 57 to each other by the bolts 58. Accordingly, by use of such board retaining portions 56 and 57, the circuit board 30 can be retained in the cover 50 without requiring any peculiar process for retaining the circuit board 30 in the cover 50. The respective components constituting the electronic component unit 1 have been described above.

Next, an assembling procedure of the electronic component unit 1 will be described. First, the connection terminal portions 21 of the L-shaped terminals 20 are press-fitted into the press-fitting holes of the connector 10 (the terminal retaining portion 11) from the rear side so as to penetrate the press-fitting holes of the connector 10 respectively with the mounting terminal portions 22 extending downward (see FIG. 3A). Thus, the terminals 20 are retained in the terminal retaining portion 11. The distal end portions of the connection terminal portions 21 are positioned inside the hood portions 12 (see FIG. 1 and FIG. 2).

Next, the aligning plate 40 is brought upward from the lower side to approach the mounting terminal portions 22 extending downward. Then, the mounting terminal portions 22 are made to penetrate the through holes of the aligning plate, and the aligning plate 40 is assembled connecting to the back face of the terminal retaining portion 11 of the connector 10 (see FIG. 3A). Thus, the mounting terminal portions 22 of the terminals 20 are aligned with the through holes 31 due to the function of the aligning plate 40.

Next, the circuit board 30 is brought upward from the lower side to approach the lower end portions of the mounting terminal portions 22 extending downward. The lower end portions of the mounting terminal portions 22 are inserted into the through holes 31 and soldered thereto so that the connector 10 is mounted on the circuit board 30. Thus, the terminals 20 and the conductor patterns of the circuit board 30 are electrically connected.

Next, the body portion 51 of the cover 50 is assembled connecting to the terminal retaining portion 11 of connector 10. Specifically, while the body portion 51 is moved downward from top relatively to the terminal retaining portion 11, the pair of the side edge portions 54 of the concave portion 53 are inserted into the corresponding cover retaining portions 13 (i.e. between the front side protrusion portions 14 and the convex parts 15a of the rear side protrusion portions 15). Further, the body portion 51 is fitted to the terminal retaining portion 11 so that the upper edge portion 55 of the concave portion 53 is inserted between the pair of the protrusive strip portions 16 and 17 (see FIG. 1). On this occasion, due to a pair of the taper portions 13a provided in each cover retaining portion 13 (a pair of the protrusion portions 14 and 15), the corresponding side edge portion 54 is easily guided between the pair of the protrusion portions 14 and 15 of the cover retaining portion 13.

In a state in which the fitting of the concave portion 53 to the terminal retaining portion 11 has been completed, the side edge portion 54 of the cover 50 is press-fitted between the pair of the protrusion portions 14 and 15 of the cover retaining portion 13. Accordingly, relative movement between the connector 10 and the body portion 51 of the cover 50 can be suppressed. That is, so-called backlash reduction is attained. Further, the upper edge portion 55 of the cover 50 is inserted between the pair of the protrusive strip portions 16 and 17. Accordingly, a simple waterproof function attained by a so-called labyrinth structure can be exerted.

Next, the bottom plate portion 52 of the cover 50 is assembled connecting to the body portion 51 so as to close the lower side opening of the body portion 51 (see FIG. 3A and FIG. 3B). Specifically, the columnar portions 56 of the body portion 51 and the concave portions 57 of the bottom plate portion 52 are fastened to each other by the bolts 58. Due to the fastening, the peripheral edge portions 32 of the circuit beard 30 are held between the columnar portions 56 and the concave portions 57. As a result, the circuit board 30 is retained in the cover 50. Through the aforementioned steps, the assembling of the electronic component unit 1 is completed.

According to the electronic component unit 1 according the embodiment of the present invention, as described above, the side edge portions 54 of the cover 50 are press-fitted to the pairs of the protrusion portions 14 and 15 of the cover retaining portions 13 belonging to the connector 10. Thus, relative movement between the connector 10 and the cover 50 can be suppressed. Further the circuit board 30 is retained in the cover 50 by use of the board retaining portions (the columnar portions 56 and the concave portions 57 of the cover 50 in the present example). Thus, the circuit board 30 is in a state fixed to the connector 10 via the cover 50 so that relative movement between the circuit board 30 and the connector 10 can be suppressed. Accordingly, stress that may occur at the electrical contact points between the circuit board 30 and the connector 10 (specifically the terminals 20) can be reduced. Further, the step of fastening the connector 10 to the circuit board 30 by bolts as in the background art is not required, and the circuit board 30 can be retained in the cover 50 during the step of coupling the body portion 51 and the bottom plate portion 52 of the cover 50 to each other. Therefore, the manufacturing process of the electronic component unit 1 can be simplified. Accordingly, the electronic component unit 1 having the present configuration can simplify the manufacturing process while protecting the electrical contact points between the circuit board 30 and the connector 10.

Further, according to the electronic component unit 1 according to the aforementioned embodiment, a pair of the protrusion portions 14 and 15 of the cover retaining portion 13 are provided at each of at least two places (i.e. the upper end and the lower end) of the connector 10 along the assembling direction (the up/down direction) in which the cover 50 is assembled connecting to the connector 10. Thus, relative movement between the cover 50 and the connector 10 can be suppressed more firmly than that in a case where the cover 50 is retained at one place. Further, the cover 50 is retained at the upper end and the lower end of the connector 10. As a result, motion in which the cover 50 rotates relatively to the connector 10 can be suppressed properly.

Further, according to the electronic component unit 1 according to the aforementioned embodiment, the convex parts 15a are provided to protrude from one (the rear side protrusion portion 15) toward the other (the front side protrusion portion 14) of the pair of the protrusion portions 14 and 15 of the cover retaining portion 13. Thus, force required for press-fitting the cover 50 between the pair of the protrusion portions 14 and 15 can be reduced without impairing retention performance of the cover 50.

Other Embodiments

In addition, the invention is not limited to the aforementioned embodiments, but various modifications can be used within the scope of the invention. For example, the invention is not limited to the aforementioned embodiments, but changes, improvements, etc. can be made on the invention suitably. In addition, materials, shapes, dimensions, numbers, arrangement places, etc. of respective constituent elements in the aforementioned embodiments are not limited. Any materials, any shapes, any dimensions, any numbers, any arrangement places, etc. may be used as long as the invention can be attained.

Figure 5A:
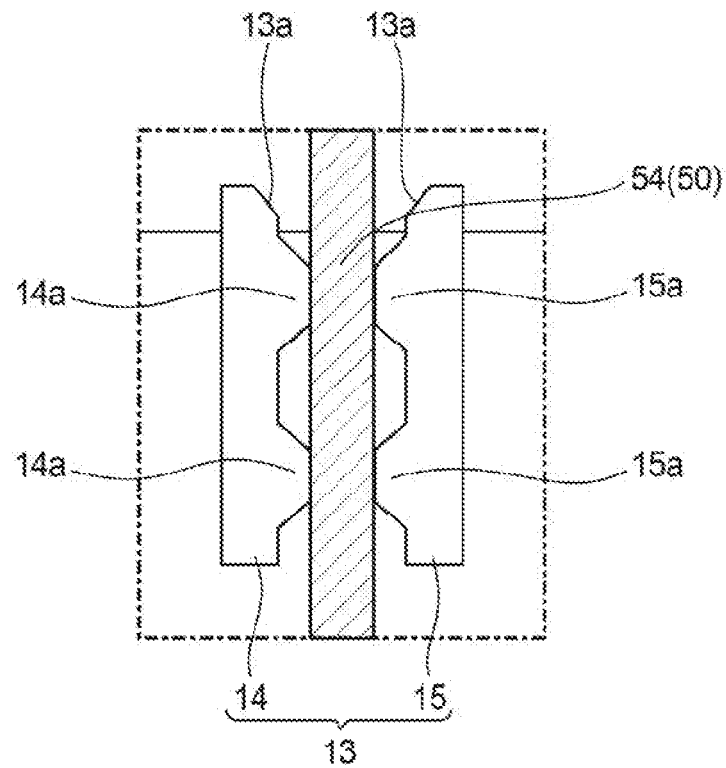
FIG. 5A is a view corresponding to FIG. 4B, of a pair of protrusion portions according to a modification.

In the aforementioned embodiment, in the rear side protrusion portion 15 of the pair of the protrusion portions 14 and 15 of the cover retaining portion 13, the convex parts 15a are provided at two places with a preset interval in the up/down direction. Convex parts corresponding to the convex parts 15a are not provided in the front side protrusion portion 14 (see FIG. 4B) On the other hand, as shown in FIG. 5A, in the front side protrusion portion 14, convex parts 14a protruding toward the rear (the rear side protrusion portion 15) may be provided at two places with a preset interval in the up/down direction corresponding to the two convex parts 15a.

Figure 5B:
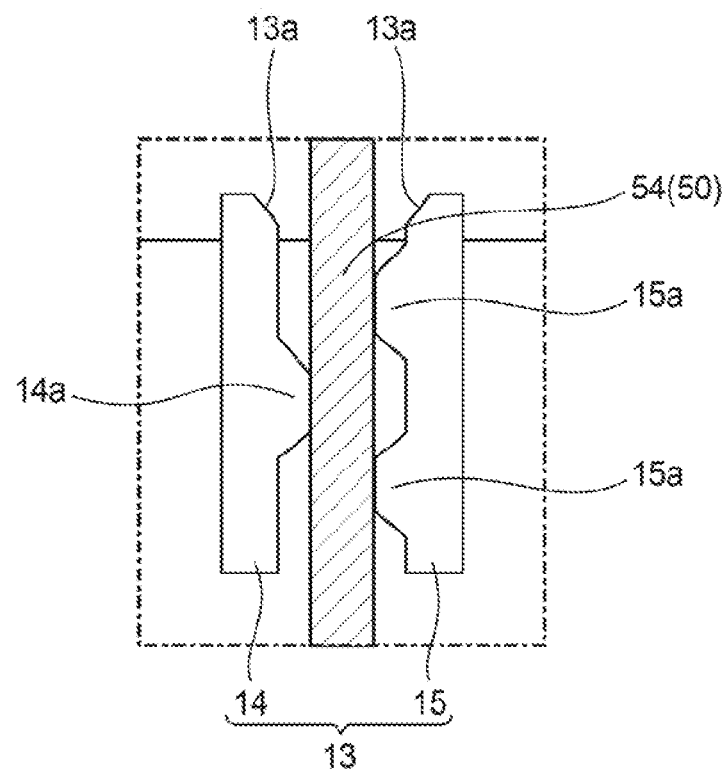
FIG. 5B is a view corresponding to FIG. 4B, of a pair of protrusion portions according to another modification.

Further, as shown in FIG. 5B, in the front side protrusion portion 14, a convex part 14a protruding toward the rear (the rear side protrusion portion 15) may be provided at an up/down-direction position corresponding to an intermediate part between the two convex parts 15a. Thus, retention performance of the cover 50 attained by the cover retaining portion 13 can be further improved.

Further, in the aforementioned embodiment, the columnar portions 56 and the concave portions 57 which are portions of the cover 50 are used as the "board retaining portions" (see FIG. 3A and FIG. 3B). On the other hand, for example, rod members made of a resin and serving as components separate from the cover 50 may be used as the "board retaining portions" so that one end of each of the rod members can be fixed to inner wall faces and the other ends of the rod members can be fixed to the circuit board 30. Thus, the circuit board 30 is retained at the cover 50 via the rod members (the board retaining portions). In this way, any members can be used as the "board retaining portions" as long as they can retain the circuit board 30 at the cover 50. The "board retaining portions" may be members integrated with the cover 50 or may be members separate from the cover 50.

Here, the aforementioned characteristics of the embodiment of the electronic component unit 1 according to the present invention will be summarized and listed briefly in the following configurations [1] to [4] respectively.

[1] An electronic component unit (1) comprising.
a circuit board (30) to mount an electronic component on the circuit board (30); a connector (10) to receive and retain a terminal to be electrically connected to the circuit board (30); and a cover (50) assembled to the connector (10) and housing the circuit board (30),
the circuit board (30) being retained with the cover (50) by using a board retaining portion (56, 57) integrated with or separate from the cover (50),
the connector (10) having a cover retaining portion (13) including a pair of protrusion portions (14, 15), the cover retaining portion (13) retaining the cover (50) assembled to the connector (10) by holding a part of the cover (50) between the pair of the protrusion portions (14, 15).

[2] The electronic component unit (1) according to the item [1], wherein
the cover (50) is assembled to the connector (10) while moving in a preset assembling direction relatively to the connector (10), one of the cover retaining portion (13) and another of the cover retaining portion (13) are located to sandwich a center point (P) of the connector (10) in the assembling direction.

[3] The electronic component unit (1) according to the item [1] or [2], wherein
at least one of the pair of the protrusion portions (14, 15) has a convex part (14a, 15a) protruding toward another of the pair of the protrusion portions (14, 15).

[4] The electronic component unit (1) according to the item [3], wherein
the one (15) of the pair of the protrusion portions (14, 15) has at least two convex parts (15a) arranged with a preset interval in the assembling direction,
the another (14) of the pair of the protrusion portions (14, 15) has the convex part (14a) protruding toward the one (15) of the pair of the protrusion portions at a position corresponding to an intermediate part between the at least two convex parts (15a) of the one (15) of the pair of protrusion portions.

REFERENCE SIGNS LIST 1 electronic component unit
10 connector
13 cover retaining portion
14 front side protrusion portion (the other of pair of protrusion portions)
14a convex part
15 rear side protrusion portion (one of pair of protrusion portions)
15a convex part
20 terminal
30 circuit board
50 cover
54 side edge portion (portion of cover)
56 columnar portion (board retaining portion)
57 concave portion (board retaining portion)

The invention claimed is:

1. An electronic component unit comprising:
a circuit board to mount an electronic component on the circuit board;
a connector having a rectangular parallelepiped shape and configured to receive and retain a terminal to be electrically connected to the circuit board; and
a cover configured to be assembled to the connector in an up/down direction and housing the circuit board,
the circuit board being retained with the cover by using a board retaining portion integrated with or separate from the cover,
the connector having at least one a cover retaining portion on an outer surface thereof which extends in the up/down direction and includes a pair of protrusion portions which protrudes perpendicular to the up/down direction, the at least one cover retaining portion retaining the cover assembled to the connector by holding a part of the cover between the pair of the protrusion portions.

2. The electronic component unit according to claim 1, wherein
the cover is assembled to the connector while moving downwardly relatively to the connector,
the at least one cover retaining portion comprises a first and a second cover retaining portion which are aligned on the outer surface in the up/down direction along the circumferential direction of the connector to sandwich a center point of the connector in the up/down direction.

3. The electronic component unit according to claim 1, wherein
   at least one of the pair of the protrusion portions has a convex part protruding toward another of the pair of the protrusion portions.

4. The electronic component unit according to claim 3, wherein
   the one of the pair of the protrusion portions has at least two convex parts arranged with a preset interval in the assembling direction,
   the another of the pair of the protrusion portions has the convex part protruding toward the one of the pair of the protrusion portions at a position corresponding to an intermediate part between the at least two convex parts of the one of the pair of protrusion portions.

5. The electronic component unit according to claim 1, wherein
   the connector further comprises a pair of protrusive strip portions extending in the width direction on the outer surface of the connector and separated from each other by a preset distance in a front/rear direction, wherein the pair of protrusive strip portions are aligned with the at least one cover retaining portion on the outer surface in the up/down direction along the circumferential direction of the connector.

* * * * *